(12) United States Patent
Hawrylchak et al.

(10) Patent No.: US 10,571,337 B2
(45) Date of Patent: Feb. 25, 2020

(54) THERMAL COOLING MEMBER WITH LOW TEMPERATURE CONTROL

(71) Applicant: Applied Materials, Inc., Santa Clara, CA (US)

(72) Inventors: Lara Hawrylchak, Gilroy, CA (US); Samuel C. Howells, Portland, OR (US); Wolfgang R. Aderhold, Cupertino, CA (US); Leonid M. Tertitski, Vista, CA (US); Michael Liu, Saratoga, CA (US); Dongming Iu, Union City, CA (US); Norman L. Tam, Cupertino, CA (US); Ji-Dih Hu, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 119 days.

(21) Appl. No.: 15/663,037

(22) Filed: Jul. 28, 2017

(65) Prior Publication Data

US 2018/0340832 A1    Nov. 29, 2018

Related U.S. Application Data

(60) Provisional application No. 62/514,624, filed on Jun. 2, 2017, provisional application No. 62/511,640, filed on May 26, 2017.

(51) Int. Cl.
*G01J 5/00* (2006.01)
*H01L 21/324* (2006.01)
(Continued)

(52) U.S. Cl.
CPC ............ *G01J 5/0007* (2013.01); *G01J 5/602* (2013.01); *G05D 23/1931* (2013.01);
(Continued)

(58) Field of Classification Search
CPC ... H01L 23/34; H01L 23/46; H01L 2023/405; H01L 2023/4056; H01L 21/67248; H01L 23/427; G01J 5/00
(Continued)

(56) References Cited

U.S. PATENT DOCUMENTS 5,814,536 A * 9/1998 Rostoker ............. H01L 21/4878
                                                    257/E23.102
6,072,163 A * 6/2000 Armstrong ........ H01L 21/67103
                                                    118/724
(Continued)

*Primary Examiner* — Gail Kaplan Verbitsky
(74) *Attorney, Agent, or Firm* — Patterson + Sheridan LLP

(57) ABSTRACT

Examples described herein generally relate to apparatus and methods for rapid thermal processing (RTP) of a substrate. In one example, a process chamber includes chamber body, a window disposed on a first portion of the chamber body, a chamber bottom, and a shield disposed on a second portion of the chamber body. The shield has a flat surface facing the window to reduce reflected radiant energy to a back side of a substrate disposed in the process chamber during operation. The process chamber further includes an edge support for supporting the substrate and a cooling member disposed on the chamber bottom. The cooling member is disposed in proximity of the edge support to cool the edge support during low temperature operation in order to improve the temperature uniformity of the substrate.

12 Claims, 11 Drawing Sheets

(51) Int. Cl.
   *G05D 23/19*   (2006.01)
   *H01L 21/66*   (2006.01)
   *H05B 1/02*    (2006.01)
   *G01J 5/60*    (2006.01)
   *H01L 21/687*  (2006.01)
   *H05B 3/00*    (2006.01)
   *H01L 21/67*   (2006.01)

(52) U.S. Cl.
   CPC ...... *H01L 21/324* (2013.01); *H01L 21/67109* (2013.01); *H01L 21/67115* (2013.01); *H01L 21/68735* (2013.01); *H01L 22/10* (2013.01); *H01L 22/12* (2013.01); *H01L 22/20* (2013.01); *H05B 1/0233* (2013.01); *H05B 3/0047* (2013.01); *G01J 2005/0051* (2013.01)

(58) Field of Classification Search
   USPC .............. 374/4, 29, 5, 121, 141, 178, 208; 62/440, 903
   See application file for complete search history.

(56) References Cited

U.S. PATENT DOCUMENTS

| | | | |
|---|---|---|---|
| 6,805,466 B1 | 10/2004 | Ranish | |
| 6,886,976 B2* | 5/2005 | Gaasch | G01R 1/0458 324/750.09 |
| 7,112,763 B2 | 9/2006 | Hunter et al. | |
| 7,398,693 B2 | 7/2008 | Ranish et al. | |
| 7,860,379 B2 | 12/2010 | Hunter et al. | |
| 8,222,574 B2 | 7/2012 | Sorabji et al. | |
| 8,254,767 B2 | 8/2012 | Hunter et al. | |
| 8,283,607 B2 | 10/2012 | Ranish et al. | |
| 8,294,068 B2 | 10/2012 | Ranish et al. | |
| 8,367,983 B2 | 2/2013 | Ranish et al. | |
| 8,548,311 B2 | 10/2013 | Koelmel et al. | |
| 8,569,177 B2* | 10/2013 | Ohashi | H01J 37/32449 257/E21.218 |
| 2009/0081878 A1* | 3/2009 | Dhindsa | H01J 37/32091 438/729 |
| 2012/0008655 A1* | 1/2012 | Niwa | H01L 21/4882 372/36 |
| 2014/0192839 A1 | 7/2014 | Lacroix | |
| 2014/0330422 A1 | 11/2014 | Ranish | |
| 2014/0367844 A1* | 12/2014 | Hooper | H01L 23/36 257/712 |
| 2015/0189791 A1* | 7/2015 | Tamura | B23P 15/26 165/148 |
| 2015/0357215 A1 | 12/2015 | Moffatt et al. | |
| 2016/0028284 A1* | 1/2016 | Dajaku | H02K 3/28 310/54 |
| 2016/0146676 A1* | 5/2016 | Ukegawa | G01K 3/10 374/178 |
| 2016/0165755 A1* | 6/2016 | Bodenweber | H01L 23/46 165/80.2 |
| 2017/0263474 A1* | 9/2017 | Usami | H01L 21/67248 |
| 2018/0133800 A1* | 5/2018 | Pieger | B22F 3/1055 |
| 2018/0367011 A1* | 12/2018 | Bodla | H02K 9/04 |
| 2019/0000139 A1* | 1/2019 | Levine | A24F 1/28 |

* cited by examiner

THERMAL COOLING MEMBER WITH LOW TEMPERATURE CONTROL

CROSS-REFERENCE TO RELATED APPLICATIONS

This application claims benefit of U.S. Provisional Patent Applications, Ser. No. 62/511,640, filed May 26, 2017, and Ser. No. 62/514,624, filed Jun. 2, 2017, each of which is incorporated herein by reference.

BACKGROUND

Field

Embodiments described herein relate to apparatus and methods of annealing substrates. More specifically, apparatus and methods described herein relate to temperature measurement of a substrate by radiation transmission.

Description of the Related Art

Transmission pyrometry is a common mode of assessing the thermal state of a substrate (e.g., a silicon substrate). Thermal processing chambers commonly expose a substrate to intense, non-coherent or coherent radiation from thermal sources to raise the temperature of the substrate, either of the whole substrate or a part or surface area of the substrate. The radiation used to heat the substrate can create a strong background radiation environment in the chamber.

Thermal noise, or electrical fluctuations, arising from random thermal motion of electrons, from chamber thermal sources and substrate emissions can reduce accuracy and precision of conventional pyrometry methods using high-resistivity substrates, since the thermal noise is close to the optimum transmission bands for silicon. Additionally current pyrometry apparatus and methods do not measure a broad range of low to high temperatures.

Therefore, there is a need for improved apparatuses for reliable broad range temperature measurements of substrates.

SUMMARY

Examples described herein generally relate to apparatus and methods for rapid thermal processing (RTP) of a substrate. In one embodiment, a cooling member includes a first surface, a second surface opposite the first surface having a recess formed in the second surface, an outer surface connecting the first surface and the second surface, an inner surface opposite the outer surface, and one or more surfaces connecting the first surface and the inner surface, a plurality of openings formed in the one or more surfaces and in fluid communication with the recess.

In another embodiment, an apparatus includes a chamber body, a window disposed on the chamber body, a chamber bottom, a cooling member disposed on the chamber bottom, wherein the cooling member includes a first surface, a second surface opposite the first surface having a recess formed in the second surface, an outer surface connecting the first surface and the second surface, an inner surface opposite the outer surface, and one or more surfaces connecting the first surface and the inner surface, a plurality of openings formed in the one or more surfaces and in fluid communication with the recess, and a reflector plate disposed on the chamber bottom, the reflector plate secures the cooling member to the chamber bottom.

In another embodiment, a method includes directing a first radiation to a substrate disposed in a process chamber, directing a second radiation having a selected spectrum of wavelengths to a plurality of locations on the substrate, detecting the second radiation of at least two wavelengths transmitted by the substrate at the plurality of locations, and determining a temperature profile across the substrate.

BRIEF DESCRIPTION OF THE DRAWINGS

So that the manner in which the above recited features of the present disclosure can be understood in detail, a more particular description of the disclosure, briefly summarized above, may be had by reference to examples, some of which are illustrated in the appended drawings. It is to be noted, however, that the appended drawings illustrate only typical examples of this disclosure and are therefore not to be considered limiting of its scope, for the disclosure may admit to other equally effective examples.

To facilitate understanding, identical reference numerals have been used, wherever possible, to designate identical elements that are common to the Figures. Additionally, elements of one example may be advantageously adapted for utilization in other examples described herein.

DETAILED DESCRIPTION

Examples described herein generally relate to apparatus and methods for rapid thermal processing (RTP) of a substrate. In one example, a process chamber includes chamber body, a window disposed on a first portion of the chamber body, a chamber bottom, and a shield disposed on a second portion of the chamber body. The shield has a flat surface facing the window to reduce reflected radiant energy to a back side of a substrate disposed in the process chamber during operation. The process chamber further includes an edge support for supporting the substrate and a cooling member disposed on the chamber bottom. The cooling member is disposed in proximity of the edge support to cool the edge support during low temperature operation in order to improve the temperature uniformity of the substrate.

Figure 1A:
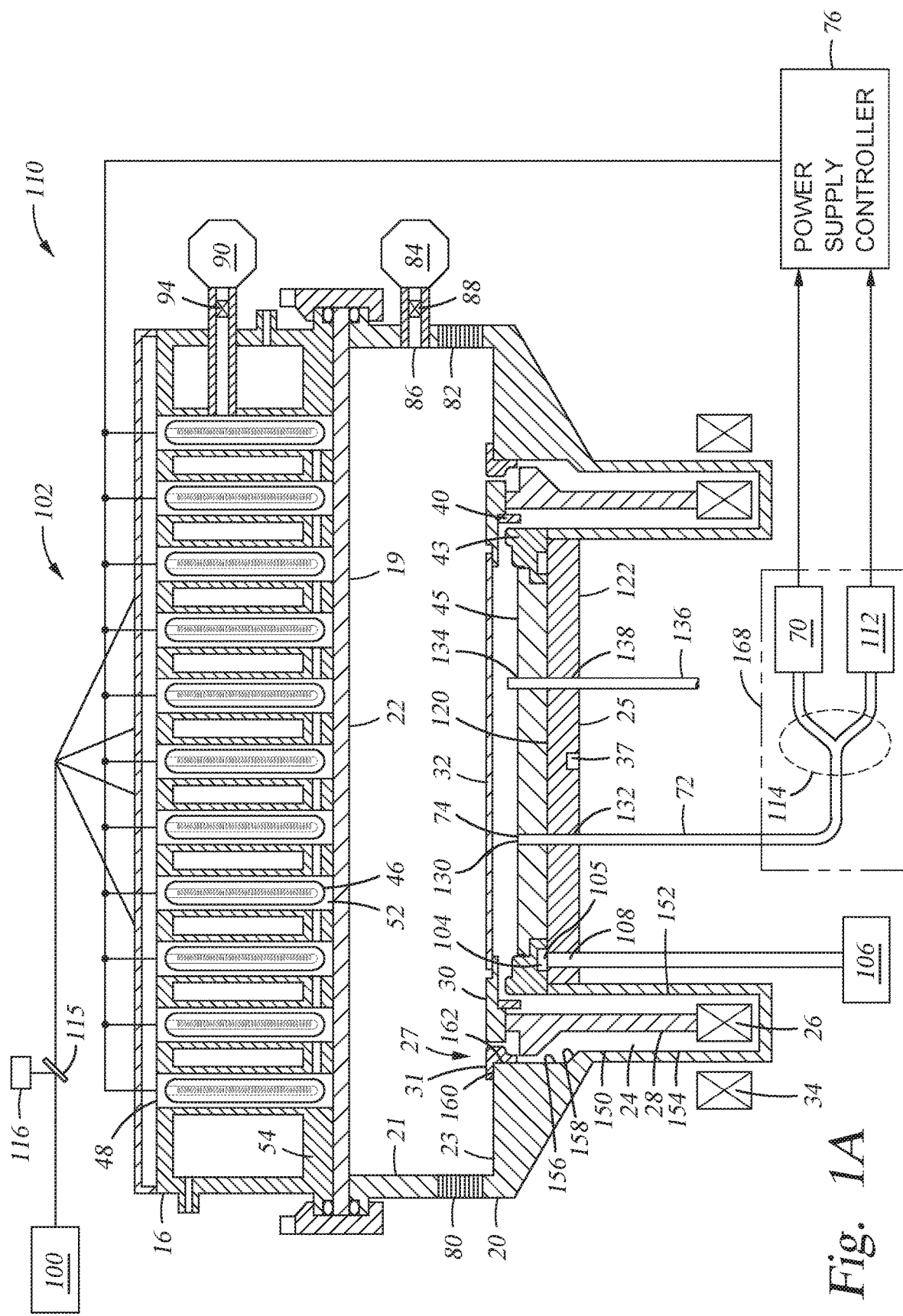
FIG. 1A is a cross sectional view of a rapid thermal processing (RTP) chamber according to embodiments of the present disclosure.

FIG. 1A is a cross sectional view of a RTP chamber 110 according to examples of the present disclosure. The chamber 110 includes a chamber body 20 having a first portion 21 and a second portion 23, and a window 22 disposed on the first portion 21 of the chamber body 20. A lamp assembly 16 is disposed on the window 22. The lamp assembly 16 includes a housing 54, a first plurality of openings 52 formed in the housing 54, and a second plurality of openings 602 (FIG. 6) formed in the housing 54. A plurality of lamps 46 is disposed in the housing 54, and each lamp 46 is disposed within a corresponding opening 52. The lamps 46 are connected to a power supply controller 76 via a plurality of electrical sockets 48. During operation, the lamps 46 emit radiation through the window 22 toward a substrate 32 disposed in the chamber 110 to heat the substrate to a predetermined temperature. The predetermined temperature may range from about 20 degrees Celsius to about 1500 degrees Celsius. In some embodiments, the substrate is heated to a relatively low temperature, such as from about 20 degrees Celsius to about 350 degrees Celsius. In some embodiments, the substrate is heated to a relatively high temperature, such as from about 350 degrees Celsius to about 1500 degrees Celsius. The window 22 is generally made of any material resistant to the processing environment and transmissive to the desired radiation. For example, quartz is typically used for the window 22 since quartz is transparent to infrared light. Other suitable materials include, but not limited to, sapphire. In further examples, the window 22 is optionally coated with an anti-reflective coating or any other suitable filters, on one or both sides of the window 22. For example, optional ultra-violet (UV) filters are used to avoid generation of ions and radicals in the chamber or damage to UV-sensitive structures on the substrate 32, if the lamps 46 have significant UV output. As another example, optional notch filters are used to admit narrow band radiation. In some embodiments, a filter 19 is coated on an inside surface of the window 22, as shown in FIG. 1A. The filter 19 blocks radiation having wavelengths within a specific range, such as between about 780 nm and about 880 nm, while transmitting radiation having wavelengths outside of the specific range. The filter 19 may be a plurality of alternating layers, such as oxide layers. In one embodiment, the filter 19 includes alternating silicon dioxide layers and titanium dioxide layers, and silicon dioxide layers are located at opposite ends of the filter. In one embodiment, the filter 19 includes a total of 30 to 50 alternating layers. The filter 19 may be coated on an outside surface (facing the lamp assembly 16) of the window 22, an inside surface (facing the substrate support) of the window 22, or may be embedded in the window 22.

Figure 6:
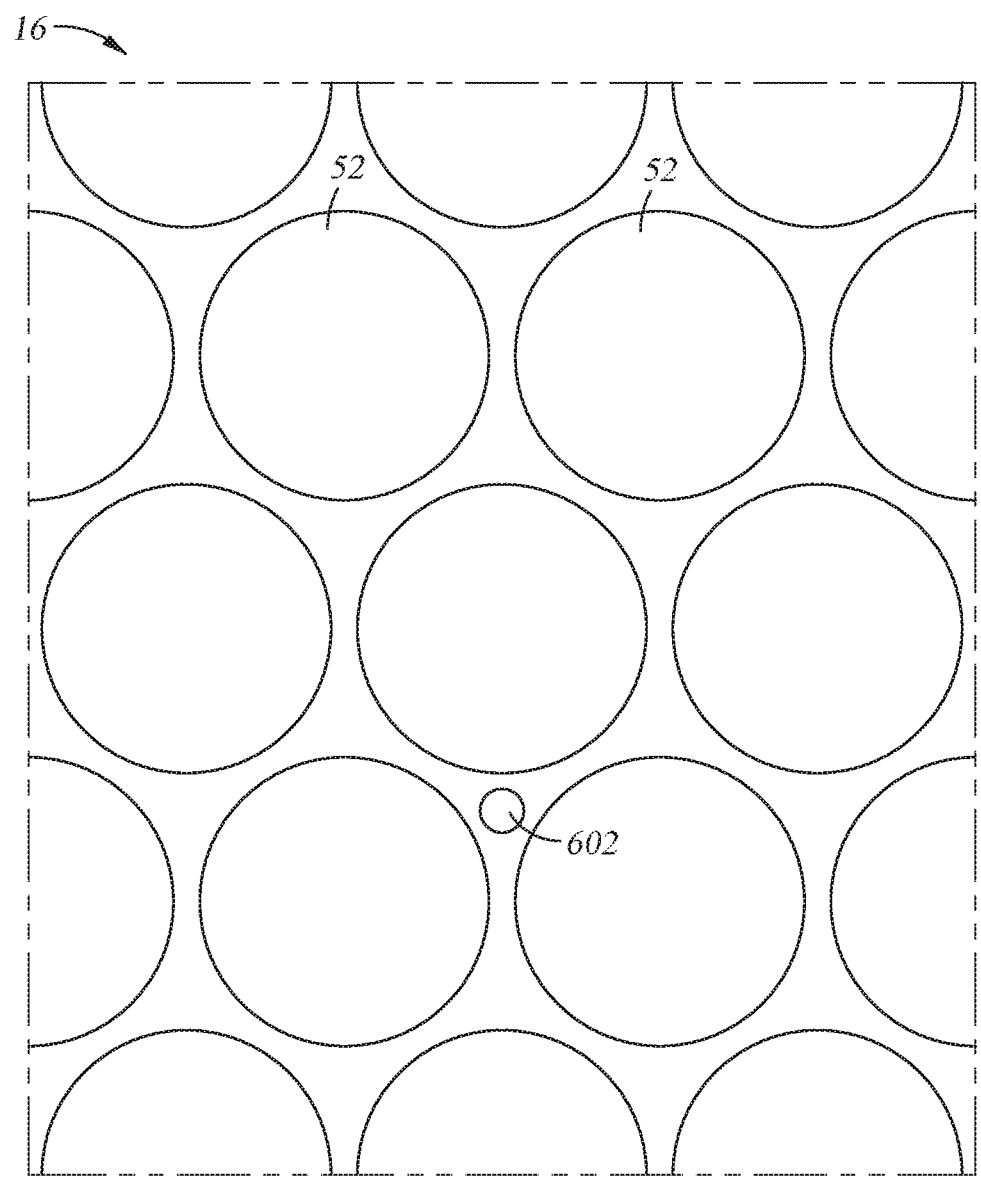
FIG. 6 is a bottom view of a portion of the lamp assembly according to embodiments of the present disclosure.

A radiation source 100 is connected to the lamp assembly 16 via a source manifold 102. For clarity, the radiation source 100 is shown as being located outside of the chamber 110; however, it is also contemplated that the radiation source 100 may be located inside the chamber 110. In one embodiment, the radiation source 100 comprises one or more radiation sources coupled to or mounted directly on the lamp assembly 16. In other embodiments, which are contemplated by the present disclosure, the radiation source 100 is located inside of the lamp assembly 16, attached to the lamp assembly 16, immediately outside of the lamp assembly 16, or positioned at another suitable location. The radiation source 100 generates radiation for input to the source manifold 102. The radiation emitted by the radiation source 100 generally travels through the source manifold 102, or splitter, to an incident area of a receiving surface of the substrate 32 in the chamber 110 via the second plurality of openings 602 (FIG. 6).

The radiation source 100 generally includes one or more radiation emitting devices that are distinct from the lamps 46. In one embodiment, the radiation source 100 comprises a single radiation emitting device capable of emitting radiation at various wavelengths. For example, the radiation source 100 may be a single broadband laser such as a supercontinuum laser capable of emitting radiation over a broad continuum of wavelengths. The radiation source 100 may be a single broadband light emitting diodes (LEDs) capable of emitting radiation over a broadband continuum of wavelengths. In one embodiment, the radiation source 100 comprises two or more radiation emitting devices, and the two or more radiation emitting devices emit radiation at different wavelengths. For example, the radiation source 100 may be two or more lasers or LEDs. The radiation source 100 may produce pulsed radiation or continuous radiation. In one embodiment, the radiation source 100 emits pulses of radiation in bands centered at 1030 nm and pulses of radiation in bands centered at 1080 nm.

The chamber 110 optionally includes a beam splitter 115 in optical communication with the radiation emitted by the radiation source 100. In operation, the beam splitter 115 directs radiation from the radiation source 100 to a sampling detector 116, which is used to detect source modulation directly from the radiation source 100. The sampling detector 116 helps to compensate for any pulse-to-pulse modulation or other amplitude modulation. The beam splitter 115 typically has a low reflectance ratio, for example less than or equal to about 30 percent, such as about 20 percent, to avoid over-attenuating the radiation from the radiation source 100. In one example, the beam splitter 115 is a fiber coupled splitter, which is connected to the sampling detector 116 through a fiber. In FIG. 1A, the beam splitter 115 is shown outside of the chamber body 20; however, the beam splitter 115 may also be positioned inside of the chamber 110, and not fiber coupled to the radiation source 100, for example, in the processing region, to detect the radiation emitted from the radiation source 100.

An inlet port 80 and an outlet port 82 are formed in the first portion 21 of the chamber body 20. During operation, the pressure within the chamber 110 can be reduced to a sub-atmospheric pressure prior to introducing a process gas through the inlet port 80. A vacuum pump 84 evacuates the chamber 110 by pumping through an exhaust port 86 formed in the first portion 21 of the chamber body 20. A valve 88 disposed between the exhaust port 86 and the vacuum pump 84 is utilized to control the pressure within the chamber 110. A second vacuum pump 90 is connected to the lamp assembly 16 to reduce the pressure within the lamp assembly 16, particularly when the pressure within the chamber 110 is pumped to a reduced pressure to reduce the pressure differential across the window 22. The pressure within the lamp assembly 16 is controlled by a valve 94.

A channel 24 is formed in the chamber body 20, and a rotor 26 is disposed in the channel 24. The channel 24 may be annular. The channel 24 is located adjacent the second portion 23 of the chamber body 20. The process chamber 110 further includes a rotatable substrate support 28 disposed in the channel 24, an edge support 30 disposed on the rotatable substrate support 28, and a shield 27 disposed on the second portion 23 of the chamber body 20. The rotatable substrate support 28 is fabricated from a material having high heat resistivity, such as black quartz. In one embodiment, the rotatable substrate support 28 is a cylinder. In one embodiment, the edge support 30 is an edge ring.

The channel 24 has an outer wall 150 and an inner wall 152. A lower portion 154 of the outer wall 150 has a first radius and an upper portion 156 of the outer wall 150 has a second radius greater than the first radius. A third portion 158 of the outer wall 150 connecting the first portion 154 to the second portion 156 extends linearly from the first portion 154 to the second portion 156, forming a slanted surface that faces toward the edge support 30. The shield 27 has a first portion 160 that rests on the second portion 23 of the chamber body 20 and a second portion 162 that extends into the channel 24 along the upper portion 156 of the outer wall 150. The first portion 160 contacts the chamber body 20, and the second portion 162 contacts the outer wall 150. The shield 27 extends partially over the channel 24. In one embodiment, the shield 27 is a rotor cover. The shield 27 may be an annular ring. The shield 27 may be fabricated from a ceramic material, such as alumina. The shield 27 further includes a first surface 31 facing the window 22, and the first surface 31 is substantially flat so radiant energy is not reflected towards the substrate 32. The substantially flat first surface 31 does not face the substrate processing area to avoid reflecting radiation toward the substrate 32. In one embodiment, the first surface 31 of the shield 27 is substantially parallel to the window 22. In one embodiment, the first surface 31 is annular.

The substrate 32, such as a high resistivity silicon substrate, is disposed on the edge support 30 during operation. A stator 34 is located external to the chamber body 20 in a position axially aligned with the rotor 26. In one embodiment, the stator 34 is a magnetic stator, and the rotor 26 is a magnetic rotor. During operation, the rotor 26 rotates, which in turn rotates the rotatable substrate support 28, the edge support 30, and the substrate 32.

During operation in which the substrate 32 is heated to a relatively low temperature, such as from about 20 degrees Celsius to about 350 degrees Celsius, the edge support 30 can retain heat that can cause the temperature at the edge of the substrate 32 to be higher than the temperature at the center of the substrate 32. In order to cool the edge support 30, a cooling member 43 is disposed on the chamber body 25 and is in proximity to the edge support 30. The chamber body 25 includes a first surface 120 and a second surface 122 opposite the first surface 120. The cooling member 43 is in direct contact with the first surface 120 of the chamber bottom 25. A thickness of the edge support 30 may be over-specified to provide extra thermal mass. Such an edge support can act as a heat sink, which helps avoid overheating at the edge of the substrate 32. In one embodiment, a feature 40, such as a fin, is formed on the edge support 30 to provide extra thermal mass. The feature 40 may be continuous or discontinuous. In one embodiment, the feature 40 is cylindrical. The feature 40 may be a plurality of discrete fins. The feature 40 may be formed on a surface of the edge support 30 that is facing the channel 24. In one embodiment, the feature 40 extends into the channel 24, as shown in FIG. 1A. In some embodiments, the feature 40 is formed on a surface of the edge support 30 that is facing the window 22. The feature 40 is substantially perpendicular to a major surface of the edge support 30. In some embodiments, the feature 40 extends obliquely from the major surface of the edge support 30.

The chamber bottom 25 includes a channel 37 formed therein for a coolant to flow therethrough. In one embodiment, the coolant is water. The cooling member 43 may be fabricated from a material having high heat conductivity, such as a metal, for example, aluminum. The cooling member 43 is cooled by the chamber bottom 25 and functions as a heat sink to the edge support 30 due to the close proximity to the edge support 30. Furthermore, the cooling member 43 includes a recess 104 formed in a surface that is in contact with the first surface 120 of the chamber bottom 25.

Figure 2A:
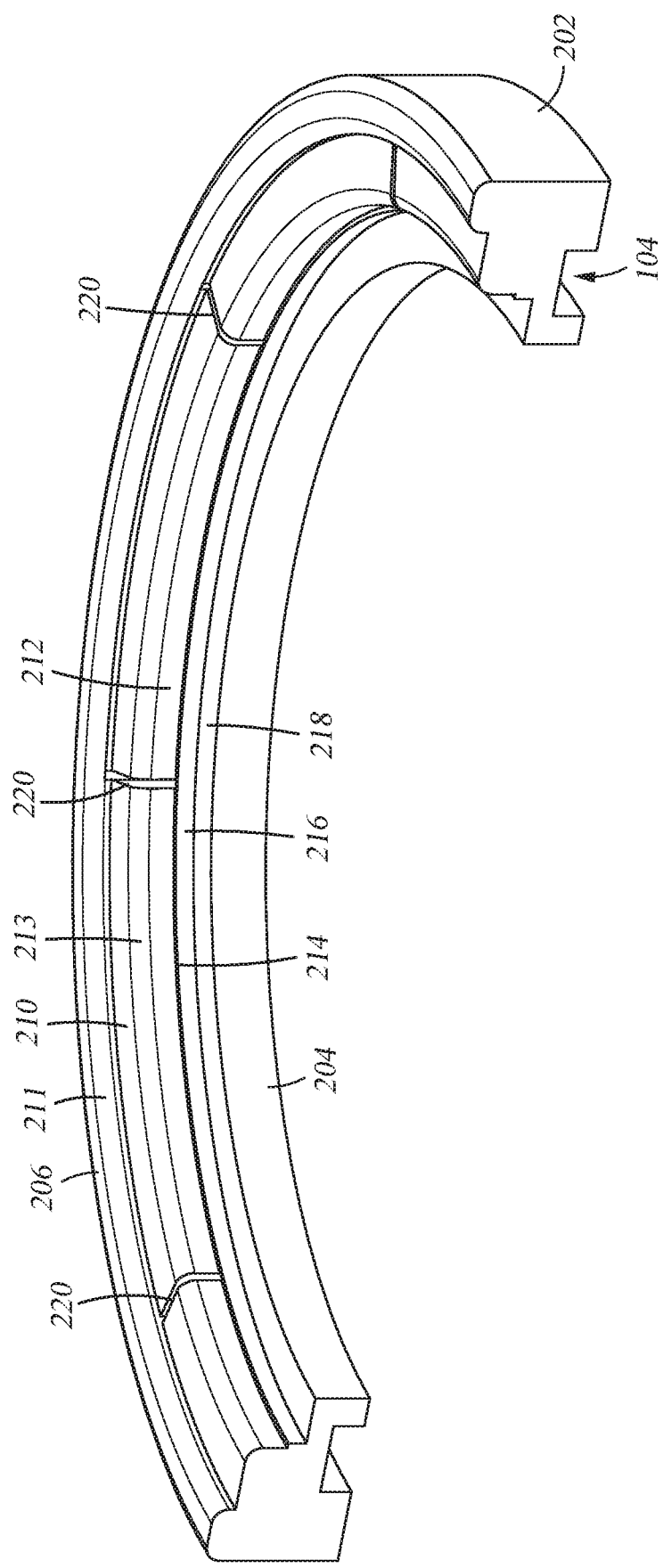
FIGS. 2A and 2B are partial perspective views of a cooling member according to embodiments of the present disclosure.

In one embodiment, the cooling member 43 is an annular ring, and the recess 104 is an annular recess. The recess 104 is in fluid communication with a plurality of openings 220 (FIG. 2A) formed in the cooling member 43, and a purge gas may be flowed from a purge gas source 106 through the cooling member 43 to provide convective cooling to the edge support 30. The purge gas may be helium, nitrogen, or other suitable gas. The purge gas flows through a channel 108 formed in the chamber bottom 25 and through a channel 105 defined by the recess 104 and the first surface 120 of the chamber bottom 25. The recess 104 of the cooling member 43 is in fluid communication with the plurality of openings 220 (FIG. 2A) formed in the cooling member 43, and the purge gas flows through the cooling member 43 via the recess 104 and the plurality of openings 220 (FIG. 2A). The cooling member 43 is described in detail in FIGS. 2A and 2B.

A reflector plate 45 is disposed on the chamber bottom 25 and surrounded by the cooling member 43. The reflector plate 45 includes a first plurality of openings 130 and a second plurality of openings 134. A plurality of lift pins 136 extends through the second plurality of openings 134. The chamber bottom 25 includes a first plurality of openings 132 and a second plurality of openings 138. Each of the first plurality of openings 132 is aligned with a corresponding opening 130 of the first plurality of openings 130, and each of the second plurality of openings 138 is aligned with a corresponding opening 134 of the second plurality of openings 134.

The chamber 110 further includes a first plurality of thermal detectors 70 and a second plurality of thermal detectors 112. The first plurality of thermal detectors 70 may be a plurality of radiation detectors, and each radiation detector may include an optical narrow-band filter having a bandpass of about 20 nm at a wavelength less than 950 nm, that is, at a photon energy somewhat above the silicon band gap of about 1.1 eV (1.1 microns), alternatively expressed as photon wavelength below the band gap wavelength of a silicon substrate, such as the substrate 32. During operation, the substrate 32 absorbs the shorter wavelength visible radiation emitted from the plurality of lamps 46 so that the first plurality of thermal detectors are sensitive to the blackbody radiation emitted from the substrate 32 rather than the radiation from the lamps 46.

The second plurality of thermal detectors 112 may be a plurality of transmission detectors that are sensitive to longer-wavelength radiation, such as radiation around the silicon band gap at a substrate temperature from about 20 degrees Celsius to about 350 degrees Celsius. The absorption gap of silicon varies from about 1000 nm to about 1200 nm for temperatures from about 20 degrees Celsius to about 350 degrees Celsius. In one embodiment, the second plurality of thermal detectors 112 are transmission pyrometry detectors. A transmission pyrometry detector generally measures radiation spectra of a substrate (e.g., a silicon substrate), such as the substrate 32, at a range of wavelengths (more than just one or two primary wavelengths) to infer the temperature of the substrate. The transmission pyrometry detector may reliably detect transmitted radiation in at least two spectral bands. The spectral bands may be generally separated from one another (e.g., at least 10 nm separation between bands, or at least 25 nm separation between central wavelength) to provide precision in resolving radiant intensity in each. The transmission pyrometry detector may be sensitive to radiation in the selected spectral bands, while filtering radiation of other wavelengths. For example, the transmission pyrometry detector may detect a spectral band of width about 10 nm-15 nm centered around 1030 nm, and the transmission pyrometry detector may also detect a spectral band of width about 10 nm-15 nm centered around 1080 nm. The transmission pyrometry detector may filter other wavelengths, for example, to an optical density of about 3.0 ("OD3"). In some embodiments, the spectral bands may be at longer wavelengths (e.g., greater than 1080 nm).

A plurality of probes 74 are disposed within the openings 130 formed in the reflector plate 45. The probes 74 extend through the opening 132 formed in the chamber bottom 25. The probes 74 may be placed in different radial zones in order to provide a temperature profile across the substrate 32. One or more probes 74 are optically connected to a detection assembly 168. The detection assembly 168 includes at least one of the first plurality of thermal detectors 70 and at least one of the second plurality of thermal detectors 112. In one embodiment, the detection assembly 168 includes a splitter 114. In one embodiment, each probe 74 is connected to one thermal detector 70 and one thermal detector 112 via a light guide 72 and the splitter 114. In some embodiments, each of the thermal detectors 70, 112 receives radiation from a dedicated probe 74 (i.e., there is one probe 74 for each detector 70, 112). During operation, the radiation source 100 generates a wide spectrum of mid-infrared radiation (e.g., including wavelengths from about 1000 nm to about 1500 nm, such as a first wavelength at 1030 nm and a second wavelength at 1080 nm). The radiation source 100 may emit, or include optics to produce, highly collimated radiation. The collimated radiation may be transmitted through one or more beam guides (e.g., a single mode optical fiber, a multi-mode optical fiber, etc.) onto the substrate 32. The beam guides may be disposed within the second plurality of openings 602 (FIG. 6) formed in the housing 54 of the lamp assembly 16. A portion of the collimated radiation may transmit through the substrate 32. The amplitude of the transmitted radiation may be a function of temperature of the substrate 32 and of the wavelength of the radiation. The probes 74 may be aligned to receive the transmitted radiation. For example, the probes 74 may be aligned with the beam guides. The probes 74 may direct the transmitted radiation to the thermal detectors 112 to determine a temperature profile across the substrate 32. The probe 74 may also receive radiation emitted from the substrate 32, and the radiation emitted from the substrate 32 may be directed to the thermal detectors 70. The detection assembly 168 directs transmitted radiation from the collimated radiation to the thermal detectors 112 and radiation emitted from the substrate 32 to the thermal detectors 70. In one embodiment, the splitter 114 is utilized to separate the transmitted radiation from the collimated radiation from the radiation emitted from the substrate 32. In another embodiment, a reflector 170 (FIG. 1B) is utilized to separate the transmitted radiation from the collimated radiation from the radiation emitted from the substrate 32. The measured temperature profile across the substrate 32 is sent to the power supply controller 76, which controls the power supplied to the lamps 46 in response to the measured temperature profile.

Figure 1B:
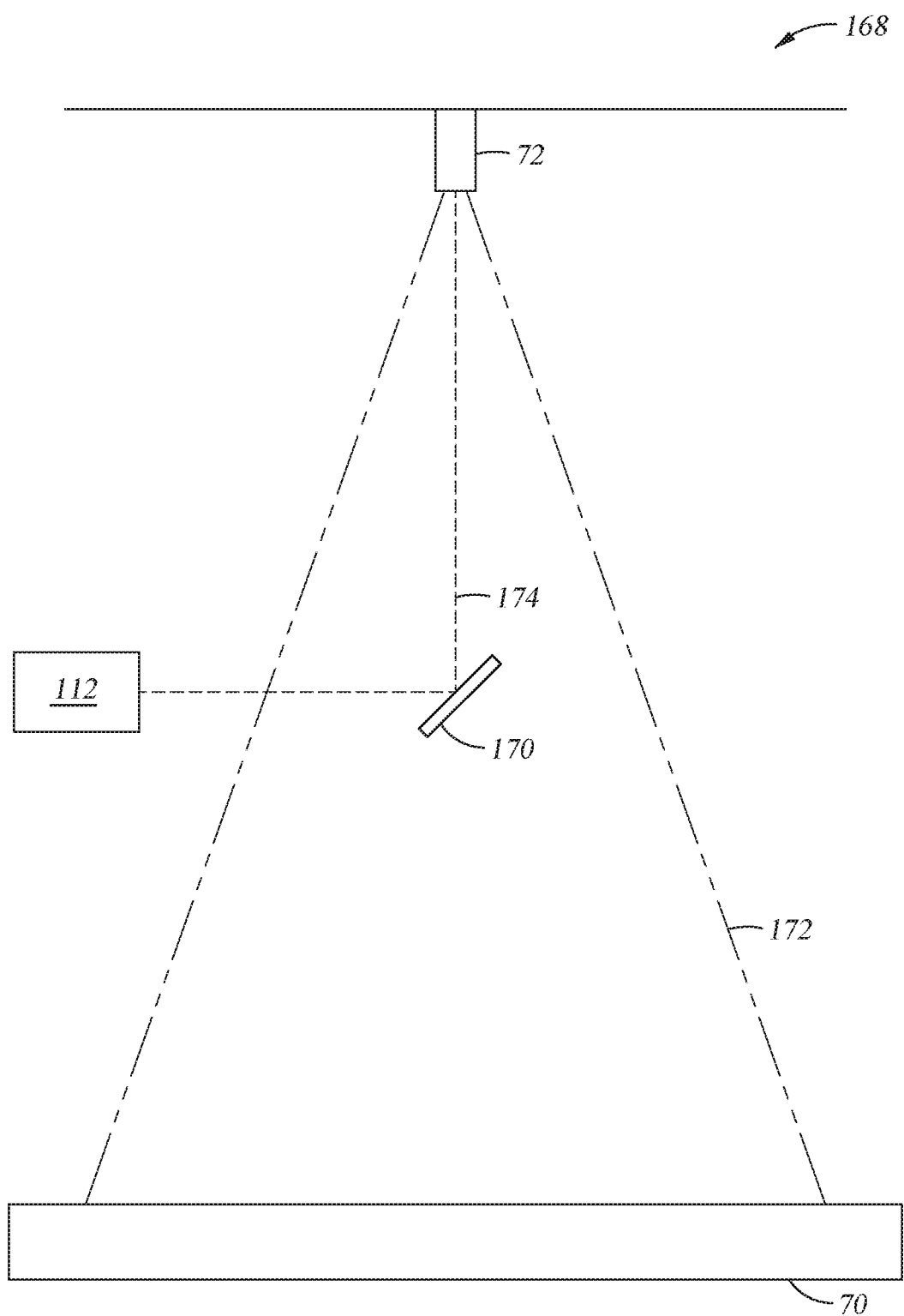
FIG. 1B is a schematic side view of a detection assembly according to embodiments of the present disclosure.

FIG. 1B is a schematic side view of the detection assembly 168 according to embodiments of the present disclosure. As shown in FIG. 1B, a first radiation 172 and a second radiation 174 exit the light guide 72. The first radiation 172 is the radiation emitted from the substrate 32 and is un-collimated. The first radiation 172 thus has a large numerical aperture. The second radiation 174 is the transmitted radiation from the collimated radiation and is collimated. The second radiation 174 thus has a small numerical aperture. In one embodiment, the detection assembly 168 includes the reflector 170. The reflector 170 may be any suitable device that can redirect radiation. In one embodiment, the reflector 170 is a mirror. The reflector 170 is disposed along a path of the second radiation 174 and the reflector 170 reflects all, or a substantial portion of, the second radiation 174 to the thermal detector 112. Thus, the reflector 170 is aligned with both the light guide 72 and the thermal detector 112. In one embodiment, the light guide 72 is disposed along an axis that is substantially perpendicular to a major axis of the thermal detector 112. Because the second radiation 174 is highly collimated, the size of the reflector 170 and the detecting surface of the thermal detector 112 can be relatively small. The first radiation 172 is transmitted to the thermal detector 70. Because the first radiation 172 is un-collimated, the detection surface of the thermal detector 70 is relatively large as shown compared to the detection surface of the thermal detector 112. Furthermore, even though the reflector 170 is disposed along the path of the first radiation 172, the reflector 170 does not significantly change the amount of radiation transmitted to the thermal detector 70 due to the relatively small size of the reflector 170. The detection assembly 168 is utilized to separate the first radiation 172 and the second radiation 174 based on the numerical aperture of the radiations 172, 174.

Figure 2B:
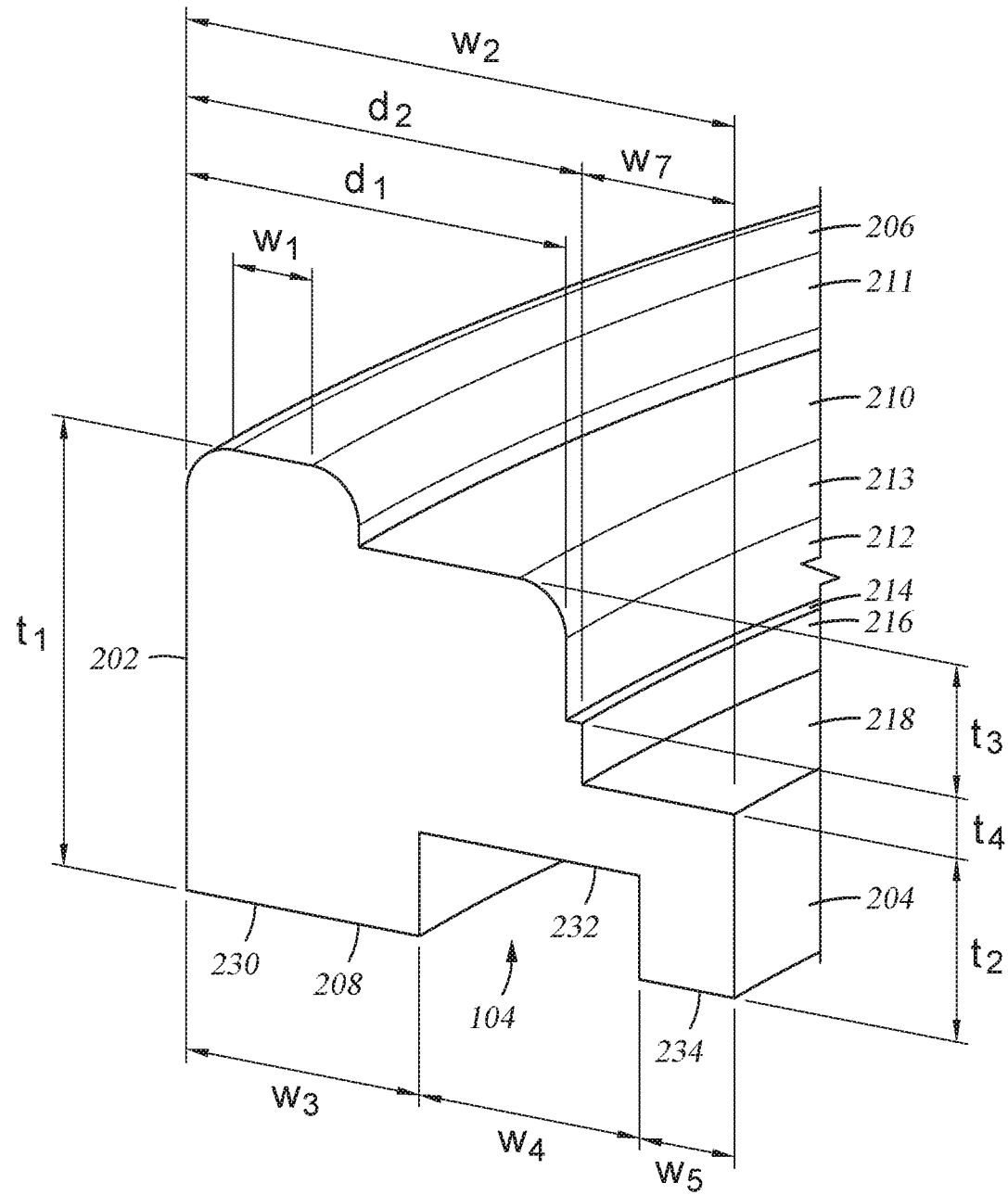

FIGS. 2A and 2B are partial perspective views of the cooling member 43 according to embodiments of the present disclosure. As shown in FIGS. 2A and 2B, the cooling member 43 includes an outer surface 202 and an inner surface 204 opposite the outer surface 202. The outer surface 202 may be substantially parallel to the inner surface 204. In one embodiment, the outer surface 202 and the inner surface 204 are cylindrical. The outer surface 202 has a first thickness $t_1$ and the inner surface 204 has a second thickness $t_2$. The first thickness $t_1$ is substantially greater than the second thickness $t_2$. The cooling member 43 further includes a first surface 206 facing the edge support 30 (FIG. 1A) and a second surface 208 opposite the first surface 206. In one embodiment, the first surface 206 and the second surface 208 are annular. The recess 104 is formed in the second surface 208. The second surface 208 includes a first portion 230, a second portion 232 that is recessed from the first portion 230, and a third portion 234 that is coplanar with the first portion 230. The first portion 230 and the third portion 234 of the second surface 208 may be in direct contact with the first surface 120 of the chamber bottom 25. The first surface 206 is substantially parallel to the first portion 230 and third portion 234 of the second surface 208. The first surface 206 may or may not be substantially parallel to the second portion 232 of the second surface 208. In one embodiment, the first portion 230, the second portion 232, and the third portion 234 are annular. The first surface 206 has a first width $w_1$, the second surface 208 has a second width $w_2$, the first portion 230 of the second surface 208 has a third width $w_3$, the second portion 232 of the second surface 208 has a fourth width $w_4$, and the third portion 234 of the second surface 208 has a fifth width $w_5$. In one embodiment, the cooling member 43 is an annular ring, and the widths $w_1$, $w_2$, $w_3$, $w_4$ and $w_5$ are radial widths. In one embodiment, the width $w_2$ is substantially greater than the width $w_1$. In one embodiment, the width $w_1$ is substantially the same as the width $w_3$.

The cooling member 43 further includes a third surface 210 located below a plane defined by the first surface 206.

The third surface 210 may be substantially parallel to the first surface 206. In one embodiment, the third surface 210 is annular. The third surface 210 may be located radially inward from the first surface 206. The third surface 210 has a width $w_6$. In one embodiment, the width $w_6$ is substantially less than the width $w_1$. The width $w_6$ may be within the width $w_4$. The first surface 206 and the third surface 210 are connected by a first connecting surface 211. The first connecting surface 211 may be linear or curved. The first connecting surface 211 may form a 90 degree angle or an obtuse angle with respect to the third surface 210. The cooling member 43 further includes a fourth surface 212. The fourth surface 212 may be substantially parallel to the outer surface 202. In one embodiment, the fourth surface 212 is cylindrical. The fourth surface 212 may be located radially inward from the third surface 210. A distance $d_1$ between the outer surface 202 and the fourth surface 212 is substantially greater than the width $w_3$ but substantially less than the width $w_2$. The fourth surface 212 has a thickness $t_3$ that is substantially less than the thickness $t_1$. The fourth surface 212 and the third surface 210 are connected by a second connecting surface 213. The second connecting surface 213 may be linear or curved. The second connecting surface 213 may form a 90 degree angle or an acute angle with respect to the fourth surface 212.

The cooling member 43 further includes a fifth surface 216 located radially inward from the fourth surface 212. The fifth surface 216 may be substantially parallel to the outer surface 202. In one embodiment, the fifth surface 216 is cylindrical. A distance $d_2$ between the outer surface 202 and the fifth surface 216 is substantially greater than the width $w_3$ but substantially less than the width $w_2$. The distance $d_2$ is substantially greater than the distance $d_1$. The fifth surface 216 has a thickness $t_4$ that is substantially less than the thickness $t_1$. The thickness $t_4$ may be substantially less than the thickness $t_3$. The fifth surface 216 and the fourth surface 212 are connected by a third connecting surface 214. The third connecting surface 214 may be linear or curved. The third connecting surface 214 may form a 90 degree angle or an acute angle with respect to the fifth surface 216.

The cooling member 43 further includes a sixth surface 218 connecting the fifth surface 216 and the inner surface 204. The sixth surface 218 may be substantially parallel to the first surface 206. In one embodiment, the sixth surface 218 is annular. The sixth surface 218 has a width $w_7$. The width $w_7$ is substantially less than the width $w_2$. The width $w_7$ may be substantially greater than the width $w_6$. In one embodiment, the width $w_2$ equals the width $w_7$ plus the distance $d_2$.

A plurality of openings 220 are formed in one or more surfaces of the surfaces 206, 210, 211, 212, 213, 214, 216, and the plurality of openings 220 are in fluid communication with the recess 104. During operation, for example a low temperature operation, the purge gas is flowed from the purge gas source 106 (FIG. 1A) through the cooling member 43 to provide convective cooling to the edge support 30 (FIG. 1A). The purge gas flows through the cooling member 43 via the recess 104 and the plurality of openings 220. The openings 220 may be evenly spaced apart to provide uniform flow of the purge gas below the edge support 30 (FIG. 1A). In one embodiment, the openings 220 are narrow slits. In one embodiment, the openings 220 are formed in the surfaces 210, 211, 212, 213.

Figure 3:
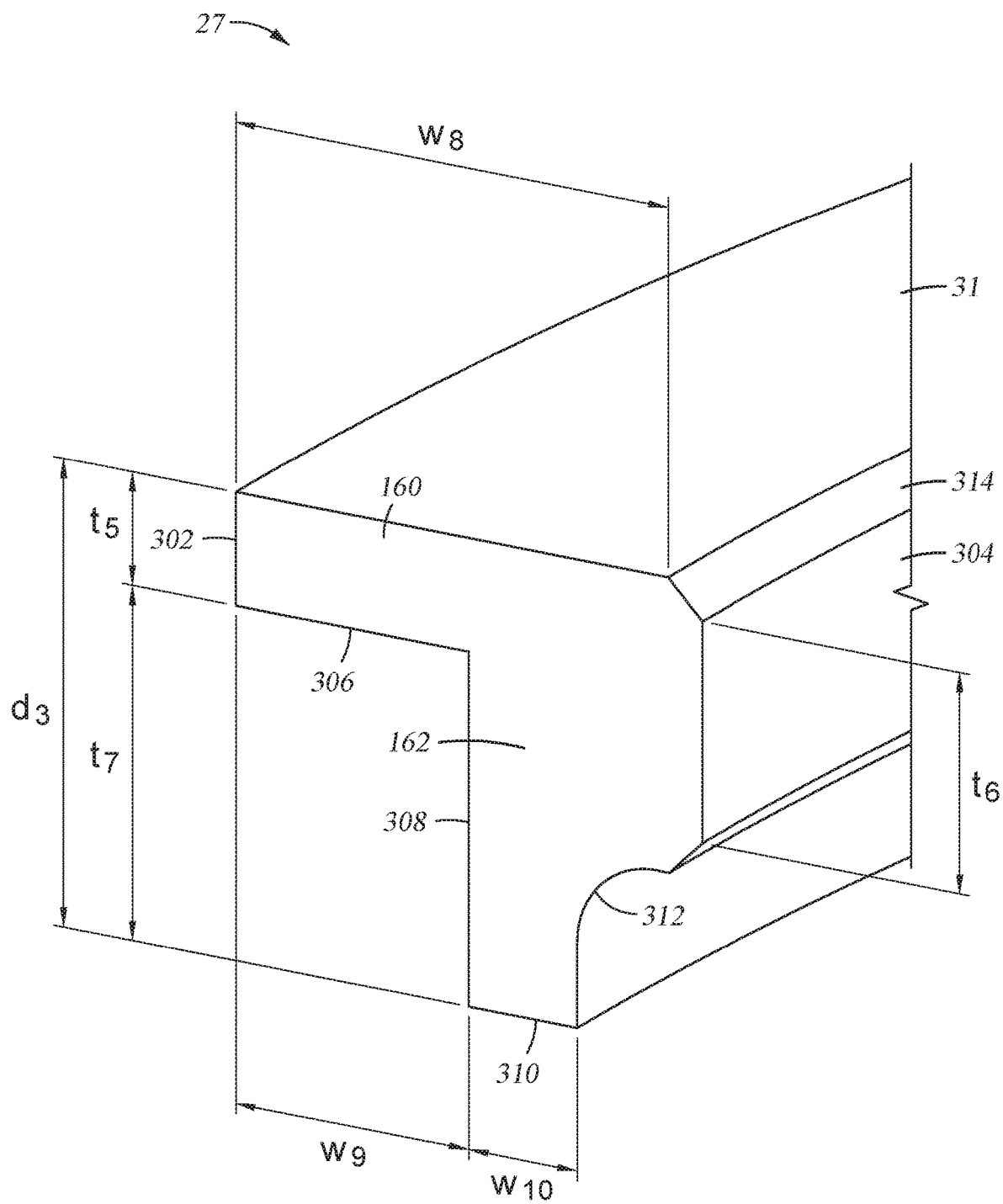
FIG. 3 is a partial perspective view of a shield according to embodiments of the present disclosure.

FIG. 3 is a partial perspective view of the shield 27 according to embodiments of the present disclosure. As shown in FIG. 3, the shield 27 includes the first surface 31 that is substantially flat. The first surface 31 has a width $w_8$.

In one embodiment, the width $w_8$ is a radial width. The shield 27 further includes an outer surface 302 and an inner surface 304. The outer surface 302 and the inner surface 304 may be substantially perpendicular to the first surface 31. The inner surface 304 may be adjacent to the edge support 30 (FIG. 1A). The outer surface 302 may be substantially parallel to the inner surface 304. In one embodiment, the outer surface 302 and the inner surface 304 are cylindrical. The outer surface 302 has a fifth thickness $t_5$ and the inner surface 304 has a sixth thickness $t_6$. The fifth thickness $t_5$ is less than the sixth thickness $t_6$. The first surface 31 and the inner surface 304 is connected by a connecting surface 314. The connecting surface 314 may be linear or curved. The connecting surface 314 may form an obtuse angle with respect to the inner surface 304.

The shield 27 further includes a second surface 306 connected to the outer surface 302. The second surface 306 may be substantially parallel to the first surface 31. The second surface 306 may be substantially perpendicular to the outer surface 302. The second surface 306 has a width $w_9$. In one embodiment, the width $w_9$ is a radial width. The width $w_9$ is less than the width $w_8$. The second surface 306 is connected to a third surface 308. The third surface 308 may be substantially parallel to the outer surface 302. The third surface 308 may be substantially perpendicular to the second surface 306. In one embodiment, the third surface 308 is cylindrical. The third surface 308 has a thickness $t_7$. In one embodiment, the thickness $t_7$ is substantially the same as the thickness $t_5$. The second surface 306 and the third surface 308 may be in contact with the second portion 23 of the chamber body 20 (FIG. 1A).

The third surface 308 is connected to a fourth surface 310. The fourth surface 310 may be substantially parallel to the first surface 31. The fourth surface 310 may be substantially perpendicular to the third surface 308. In one embodiment, the fourth surface 310 is annular. The fourth surface 310 has a width $w_{10}$. The width $w_{10}$ is less than the width $w_9$. A distance $d_3$ is between the first surface 31 and the fourth surface 310. The distance $d_3$ equals the thickness $t_5$ plus the thickness $t_7$. The fourth surface 310 and the inner surface 304 are connected by a connecting surface 312. The connecting surface 312 may be linear or curved.

Figure 4A:
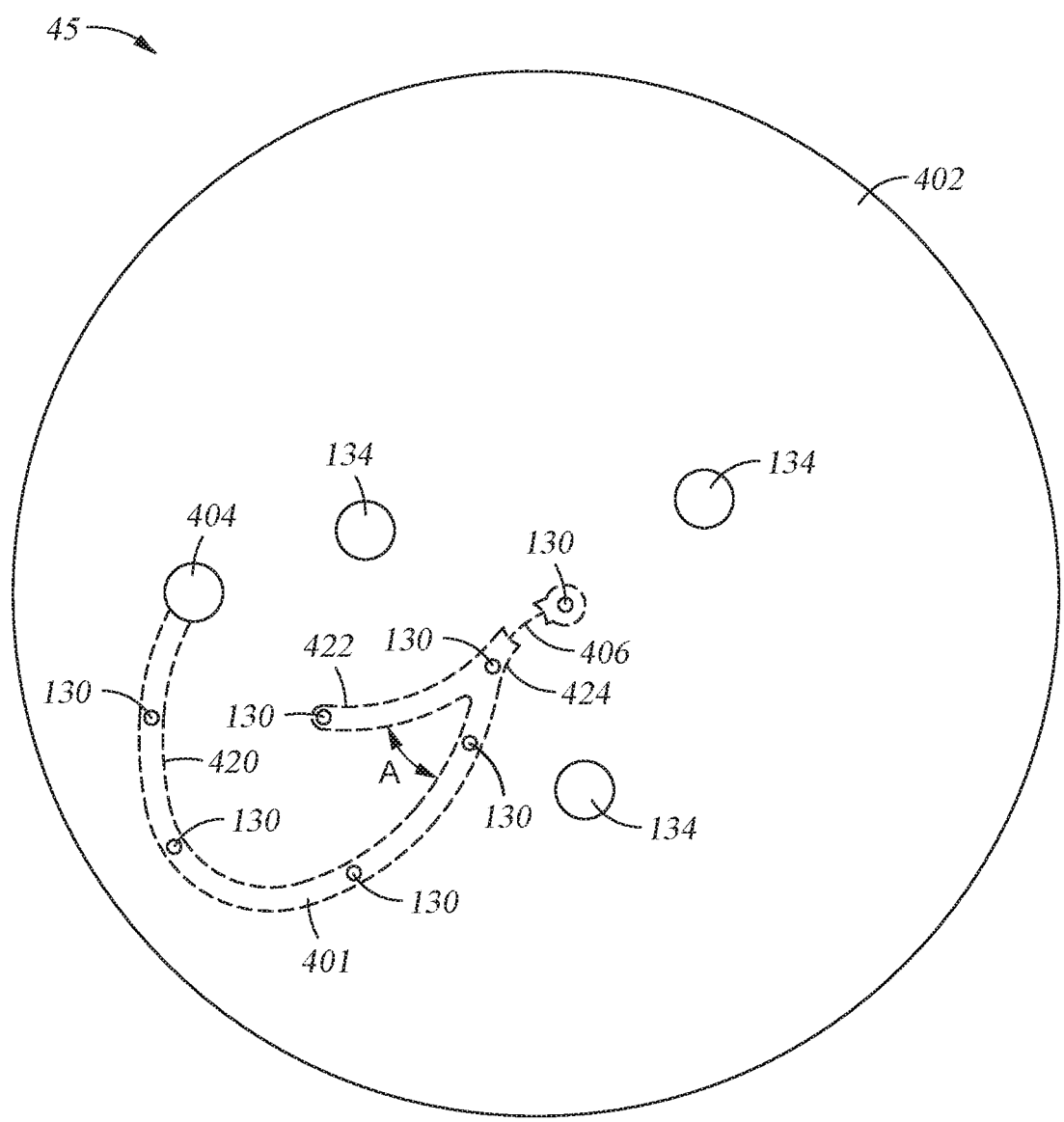
FIG. 4A is a plan view of a reflector plate according to embodiments of the present disclosure.
Figure 4B:
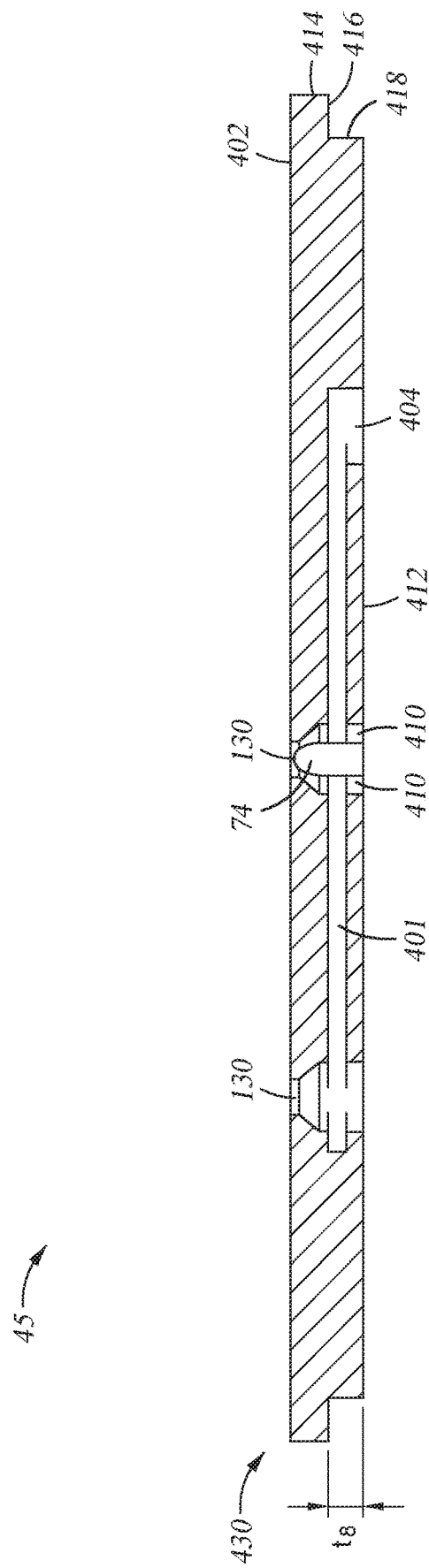
FIG. 4B is a cross sectional view of the reflector plate according to embodiments of the present disclosure.

FIG. 4A is a plan view of the reflector plate 45, and FIG. 4B is a cross sectional view of the reflector plate 45 according to embodiments of the present disclosure. As shown in FIGS. 4A and 4B, the reflector plate 45 includes the first plurality of openings 130, the second plurality of openings 134, a first surface 402 and a second surface 412 opposite the first surface 402. In one embodiment, the first surface 402 and the second surface 412 are circular. The first surface 402 faces a backside of the substrate 32 (FIG. 1A) during processing and faces the window 22 (FIG. 1A) when the substrate 32 is not being processed in the chamber 110. The second surface 412 is disposed on the chamber bottom 25 (FIG. 1A). In one embodiment, the second surface 412 is in direct contact with the first surface 120 of the chamber bottom 25 (FIG. 1A).

The reflector plate 45 further includes a ledge 430. The ledge 430 includes a portion of the first surface 402, a third surface 416 and a fourth surface 414 connecting the portion of the first surface 402 and the third surface 416. The surface 414 may be substantially perpendicular to the first surface 402. The surface 416 may be substantially parallel to the first surface 402. In one embodiment, the surface 414 is cylindrical. In one embodiment, the surface 416 is annular. The reflector plate 45 further includes a fifth surface 418 connecting the third surface 416 and the second surface 412.

The surface 418 may be substantially perpendicular to the surface 412. The surface 418 may be substantially parallel to the surface 414. In one embodiment, the surface 418 is cylindrical. The surface 418 includes a thickness $t_8$.

The reflector plate 45 is disposed on the chamber bottom 25 and is utilized to secure the cooling member 43 (FIG. 2A). The ledge 430 of the reflector plate 45 is disposed on the surface 218 of the cooling member 43. The surface 416 of the reflector plate 45 may be in direct contact with the surface 218 of the cooling member 43, and the surface 414 of the reflector plate 45 may be in direct contact with the surface 216 of the cooling member 43. In some embodiments, a small gap is formed between the surface 414 of the reflector plate 45 and the surface 216 of the cooling member 43, and the small gap represents the tolerance between a dimension, such as a diameter, of the surface 414 of the reflector plate 45 and a dimension, such as a diameter, of the surface 216 of the cooling member 43. The surface 418 of the reflector plate 45 may be in direct contact with the inner surface 204 of the cooling member 43, and the thickness $t_8$ of the surface 418 is substantially the same as the thickness $t_2$ of the inner surface 204. In some embodiments, a small gap is formed between the surface 418 of the reflector plate 45 and the inner surface 204 of the cooling member 43, and the small gap represents the tolerance between a dimension, such as a diameter, of the surface 418 of the reflector plate 45 and a dimension, such as a diameter, of the inner surface 204 of the cooling member 43.

Referring back to FIGS. 4A and 4B, the reflector plate 45 further includes a channel 401 formed therein. The plurality of openings 130 are formed along the channel 401. In one embodiment, each opening 130 of the plurality of openings 130 is through holes, as shown in FIG. 4B. Each opening 130 is in fluid communication with the channel 401. The channel 401 includes an inlet port 404 for introducing a purge gas through the channel 401. The channel 401 includes a first portion 420, a second portion 422, and a third portion 424. The first portion 420 is connected to the inlet port 404. The first portion 420 has a length that is substantially greater than a length of the second portion 422, and the length of the second portion 422 is substantially greater than a length of the third portion 424. The first portion 420 and the second portion 422 are both curved, and a radius of the curvature of the first portion 420 is substantially greater than a radius of the curvature of the second portion 422. The first portion 420 and the second portion 422 intersect at the third portion 424, and an acute angle A is formed at the intersection of the first portion 420 and the second portion 422. The third portion 424 includes a narrow portion 406 that forces the purge gas flowing within the channel 401 to the second portion 422. The purge gas may be helium, nitrogen, or other suitable gas. The purge gas exits the channel 401 via the plurality of openings 130. A plug 410 is utilized in each opening 130 at the second surface 412 of the reflector plate 45 for directing the purge gas upward, such as toward the backside of the substrate 32, when the probe 74 is disposed within the opening 130. Each probe 74 of the plurality of probes 74 is disposed in the openings 130. One probe 74 is shown in FIG. 4B for the purpose of clarity. The plurality of openings 130 and the plurality of probes 74 are located in the reflector plate 45 at locations corresponding to different controllable radial zones of the lamp assembly 16 (FIG. 1A). Each probe 74 may be connected to a thermal detector 70 and a thermal detector 112 (FIG. 1A). The thermal detector 112 may be utilized when a radiant source, such as the radiation source 100, that is different from the lamps 46, emits radiation through one or more openings 602 (FIG. 6) that are aligned with one or more probes 74.

In one embodiment, there are seven openings 130 and seven probes 74. The seven openings 130 are formed in the reflector plate 45 at locations corresponding to seven controllable radial zones of the lamp assembly 16 (FIG. 1A). In one embodiment, four openings 602 (FIG. 6) are formed in the lamp assembly 16 at alternate controllable radial zones starting from the inner most zone to guide radiation generated from the radiation source 100 (FIG. 1A) to four corresponding probes 74. The four corresponding probes 74 are located in four openings 130 of the seven openings 130, and each of the four openings 130 is aligned with a corresponding opening 602 (FIG. 6). The number of openings 602 (FIG. 6) used may depend on the space between openings 52 (FIG. 1A). In some embodiments, more than four openings are formed in the lamp assembly 16 for guiding the radiation generated from the radiation source 100 (FIG. 1A). In some embodiments, less than four openings are formed in the lamp assembly 16 for guiding the radiation generated from the radiation source 100 (FIG. 1A).

Figure 5A:
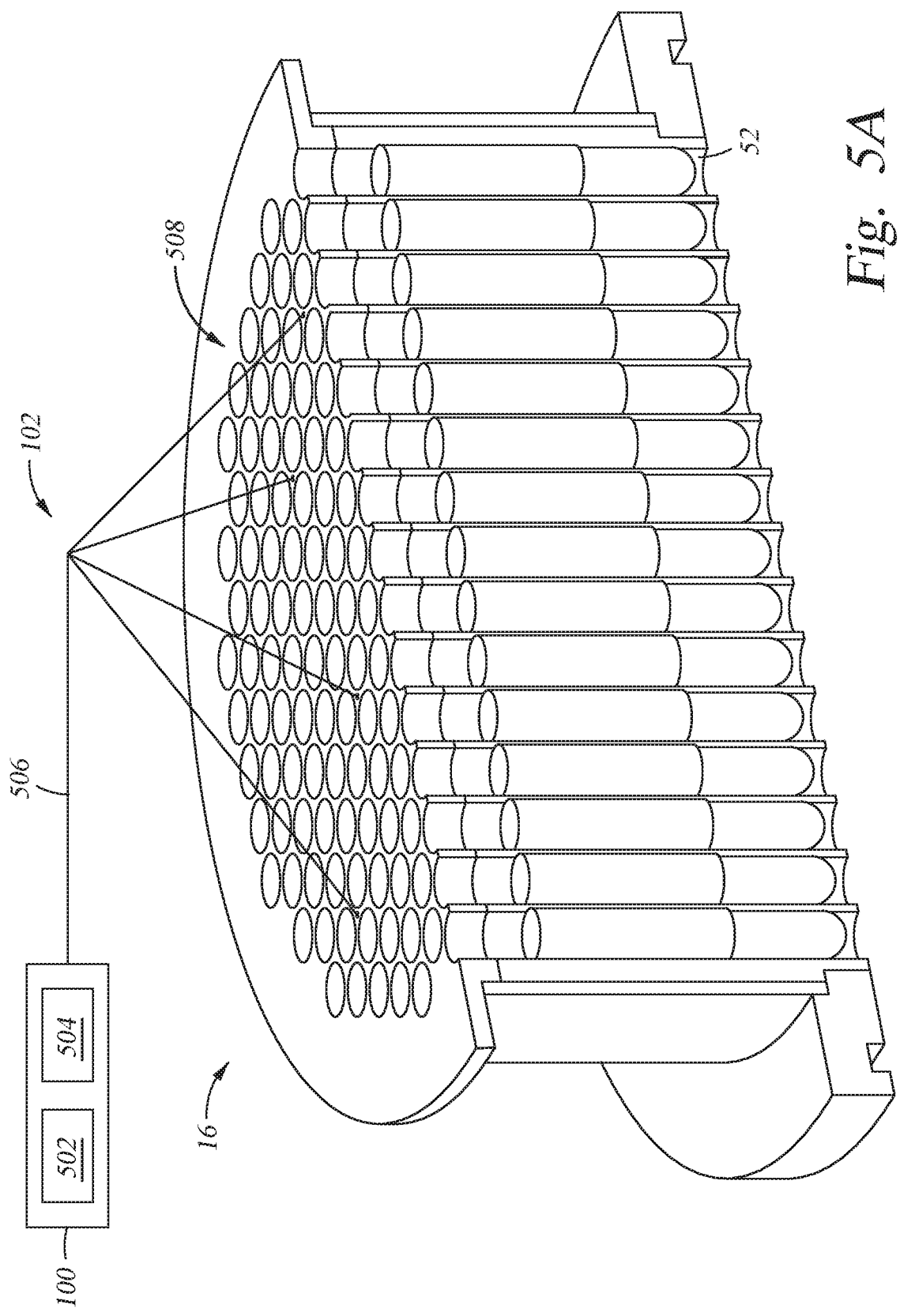
FIG. 5A is a partial perspective view of a lamp assembly and a radiation source according to embodiments of the present disclosure.
Figure 5B:
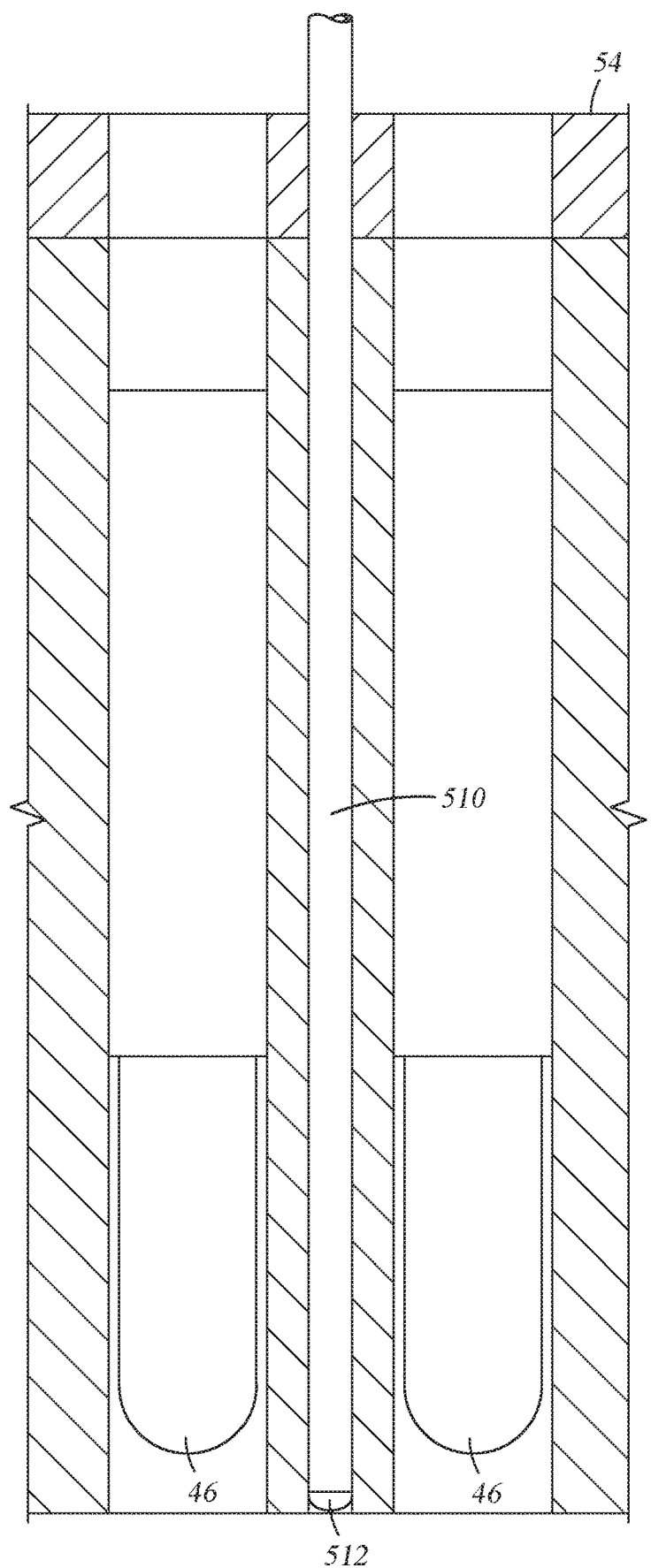
FIG. 5B is an enlarged view of a portion of FIG. 5A according to embodiments of the present disclosure.

FIG. 5A is a partial perspective view of the lamp assembly 16 and the radiation source 100 of the chamber 110, and FIG. 5B is an enlarged view of a portion of FIG. 5A according to embodiments of the present disclosure. In one embodiment, as shown in FIGS. 5A and 5B, the lamp assembly 16 includes the housing 54 and a honeycomb array 508 of openings 52. The honeycomb array 508 configuration allows for the lamps 46 positioned inside the openings 52 to be more tightly packed and closer together.

The radiation source 100 includes a first radiation source 502 and a second radiation source 504. In one embodiment, the first radiation source 502 is a high-powered laser emitting radiation at a first wavelength and the second radiation source 504 is a high-powered laser emitting radiation at a second wavelength different from the first wavelength. The radiation emitted by the radiation source 100 may be pulsed. The radiation emitted by the radiation source 100 is coupled into at least one fiber 506, which passes the radiation into the source manifold 102. The source manifold 102 may be a splitter, such as a two by four splitter, which splits the radiation into a plurality of beams. The plurality of beams is directed to the lamp assembly 16 by a plurality of beam guides 510, such as fibers. Each beam guide 510 is disposed within a corresponding opening 602 (FIG. 6). A collimating end surface 512, such as lenses, is located at a distal (from the beam guide 510) end thereof. Each beam guide 510 is aligned with a corresponding probe 74 disposed in the reflector plate 45 (FIG. 4A).

FIG. 6 is a bottom view of a portion of the lamp assembly 16 according to embodiments of the present disclosure. As shown in FIG. 6, the lamp assembly 16 includes the first plurality of openings 52 and the second plurality of openings 602. The plurality of lamps 46 is disposed within the first plurality of openings 52. The plurality of beam guides 510 is disposed within the second plurality of openings 602. Each opening 602 is aligned with a corresponding opening 130 formed in the reflector plate (FIG. 4A). In one embodiment, four openings 602 are formed in the lamp assembly 16. In one embodiment, each opening 52 is a through hole, and each opening 602 is a through hole.

During operation, a substrate, such as the substrate 32, is placed into a RTP chamber, such as the chamber 110. The substrate 32 is heated by a plurality of lamps, such as lamps 46. One or more radiation sources distinct from the plurality of lamps are utilized to facilitate the measuring of the temperature of the substrate during operation. The one or more radiation sources may be the radiation source 100. A window, such as the window 22, is disposed between radiation sources (including the plurality of lamps) and the substrate. A first plurality of thermal detectors, such as the thermal detectors 70, and a second plurality of thermal detectors, such as the thermal detectors 112, are disposed below the substrate, so the substrate is located between the radiation sources and the thermal detectors. The first plurality of thermal detectors include a first filter that transmits radiation having a first specific range of wavelength, such as from about 800 nm to about 870 nm, while blocks radiation having wavelengths outside of the first specific range. The second plurality of thermal detectors include a second filter that transmits radiation having a second specific range of wavelength, such as from about 1020 nm to about 1090 nm, while blocks radiation having wavelengths outside of the first specific range.

In order to have a more accurate measurement of the temperature of the substrate (i.e., receiving radiation emitted by the substrate), radiation having wavelength within the first specific range that is emitted by the plurality of lamps is blocked by a third filter that is coated on the window. The third filter may be the filter 19. The third filter blocks radiation having wavelengths that is detectable by the first plurality of thermal detectors (i.e., wavelengths that is in the first specific range) in order to reduce radiation "leaked" to the first plurality of thermal detectors from the plurality of lamps. Leaking of the radiation from the plurality of lamps can be caused by warping of the substrate or the type of substrate. For example, high resistivity substrates are more transparent to infrared radiation compared to low resistivity substrates, thus, radiation from the plurality of lamps can pass through the high resistivity substrate instead of being absorbed by the high resistivity substrate. In some processes, the substrate is heated to a relatively low temperature, such as from about 20 degrees Celsius to about 350 degrees Celsius, so the radiation emitted by the substrate is relatively weak compared to the "leaked" radiation either through the substrate or around the substrate.

The first plurality of thermal detectors can provide a more accurate measurement of the temperature of the substrate when the detected radiation having wavelengths within the first specific range is emitted from the substrate instead of from the plurality of lamps. In one embodiment, the third filter blocks out radiation having wavelengths from about 780 nm to about 880 nm at an optical density (OD) of 3, and the range is slightly broader than the first specific range of wavelengths that are transmissible by the first filter. By blocking out the radiation in the bandwidth of the first plurality of thermal detectors, saturation of the first plurality of thermal detectors is avoided, leading to a more accurate measurement of the temperature of the substrate.

The third filter on the window transmits radiation from the one or more radiation sources. For example, the one or more radiation sources emit radiation having a first wavelength of about 1030 nm and a second wavelength of about 1080 nm, and the third filter transmits radiation having 1030 and 1080 wavelengths. For example, the third filter transmits about 80 percent at about 1030 nm and about 85 percent or higher at about 1080 nm. The radiation from the one or more radiation sources is utilized to measure the temperature of the substrate when the substrate is heated to a relatively low temperature, such as from about 20 degrees Celsius to about 350 degrees Celsius. The radiation emitted from the one or more radiation sources is detected by the second plurality of thermal detectors, which includes the second filter that transmits radiation having a wavelength from about 1020 nm to about 1090 nm.

Because the radiation emitted from the plurality of lamps can also have a wavelength from about 1020 nm to about 1090 nm, which can be background radiation to the radiation emitted from the one or more radiation sources when detected by the second plurality of thermal detectors. In order to improve on the accuracy of the measurement of the substrate at a relatively low temperature, such as from about 20 degrees Celsius to about 350 degrees Celsius, the radiation from the one or more radiation sources is pulsed. The second plurality of thermal detectors records radiation when the one or more radiation source is on and when the one or more radiation source is off. The signal obtained by the second plurality of thermal detectors when the one or more radiation source is off is subtracted from the signal obtained by the second plurality of thermal detectors when the one or more radiation source is on, and the resulting signal (i.e., temperature) is a more accurate measurement of the temperature of the substrate. Because the radiation from the one or more radiation sources is pulsed, the background radiation can be recorded and subtracted from the measurement when the one or more radiation sources are on.

In another example, background noise in the chamber is reduced or eliminated using a Fast Fourier Transform (FFT) technique through which the signal on the second plurality of thermal detectors is transformed to produce a frequency spectrum. The frequencies corresponding to any frequencies other than the pulsed frequencies, such as lamp frequencies, are zeroed out of the frequency spectrum. Then, the frequency spectrum is reversed to eliminate the background noise, such as lamp noise, for improved temperature detection and measurement. Other background noises that may be eliminated include, but are not limited to, photonic noise, electronic noise, and/or electromagnetic noise. In another example, background noise in the chamber is reduced or eliminated using integral transform techniques to remove frequency specific noise from the signal.

Furthermore, the third filter on the window transmits the peak radiation wavelength emitted from the plurality of lamps to heat the substrate. In one embodiment, the peak radiation wavelength emitted from the plurality of lamps is just above 1 micron.

The first filter in the first plurality of thermal detectors, the second filter in the second plurality of thermal detectors, the third filter coated on the window, and the pulsing radiation from the one or more radiation sources facilitate a more accurate measurement of the temperature of the substrate, especially a high resistivity substrate, as the substrate is heated to a wide range of temperatures, such as from about 20 degrees Celsius to about 1500 degrees Celsius.

Figure 7:
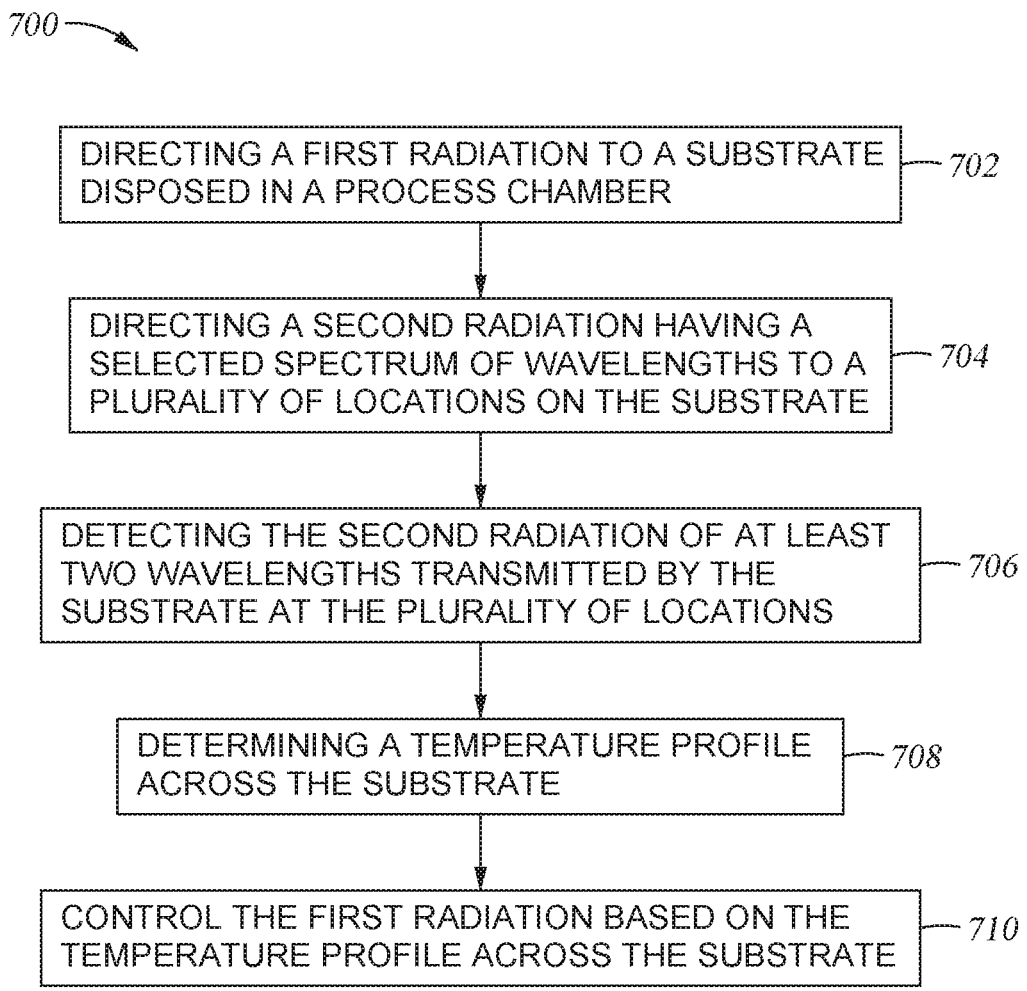
FIG. 7 is a flow chart illustrating a method for heating a substrate in the chamber of FIG. 1A according to embodiments of the present disclosure.

FIG. 7 is a flow chart illustrating a method 700 for heating a substrate in the chamber of FIG. 1A according to embodiments of the present disclosure. The method starts at block 702, at which a first radiation is directed to a substrate disposed in a process chamber. The process chamber may be a RTP chamber, such as the chamber 110. The substrate may be the substrate 32. The first radiation is emitted from a plurality of lamps, such as lamps 46. The first radiation heats the substrate to a temperature ranging from about 20 degrees Celsius to about 1500 degrees Celsius. In one embodiment, the substrate is heated by the first radiation to a low temperature, such as a between about 20 degrees Celsius to about 350 degrees Celsius. In another embodiment, the substrate is heated by the first radiation to a high temperature, such as greater than 350 degrees Celsius. The substrate may be rotated during heating by the first radiation.

Next, at block 704, a second radiation having a selected spectrum of wavelengths to a plurality of locations on the substrate. The second radiation is emitted from a radiation source different from the source that is emitting the first radiation. The radiation source for emitting the second radiation may be the radiation source 100. The selected spectrum of wavelengths may range from about 1000 nm to about 1200 nm, such as 1030 nm and 1080 nm.

Next, at block 706, the second radiation of at least two wavelengths transmitted by the substrate at the plurality of locations is detected. In one embodiment, the second radiation is detected by a plurality of probes, such as the probes 74, located in a reflector plate disposed below the substrate. The plurality of probes is disposed at locations aligned with the plurality of locations on the substrate. Each probe is connected to a detector, such as a transmission detector.

Next, at block 708, a temperature profile across the substrate is determined by the transmission detector. The temperature profile across the substrate may be substantially uniform or non-uniform. If the temperature profile across the substrate is non-uniform, the first radiation is adjusted to improve the uniformity of the temperature profile across the substrate. The first radiation may be adjusted by increase or decrease lamp power in one or more radial zones, as shown at block 710.

While the foregoing is directed to examples of the present disclosure, other and further examples of the disclosure may be devised without departing from the basic scope thereof, and the scope thereof is determined by the claims that follow.

What is claimed is:

1. A cooling member, comprising:
   an annular ring, having:
      a first surface;
      a second surface opposite the first surface and having an annular recess formed in the second surface;
      an outer surface connecting the first surface and the second surface;
      an inner surface opposite the outer surface; and
   one or more surfaces connecting the first surface and the inner surface, a plurality of openings formed in the one or more surfaces and in fluid communication with the annular recess, wherein the one or more surfaces comprises:
      a third surface,
      a first connecting surface connecting the third surface and the first surface,
      a fourth surface,
      a second connecting surface connecting the third surface and the fourth surface,
      a fifth surface, wherein the fourth surface and the fifth surface are substantially parallel to the outer surface, and
      a third connecting surface connecting the fourth surface and the fifth surface.

2. The cooling member of claim 1, wherein the annular cooling member is fabricated from a metal.

3. The cooling member of claim 1, wherein the outer surface has a first width and the inner surface has a second width substantially less than the first width.

4. The cooling member of claim 3, wherein the first surface has a first width and the second surface has a second width substantially greater than the first width.

5. The cooling member of claim 1, further comprising a sixth surface connecting the fifth surface and the inner surface.

6. The cooling member of claim 5, wherein the third surface and the sixth surface are substantially parallel to the first surface.

7. A cooling member, comprising:
   an annular ring, having:
      a first surface;
      a second surface opposite the first surface and having a recess formed in the second surface;
      an outer surface connecting the first surface and the second surface;
      an inner surface opposite the outer surface; and
      one or more surfaces connecting the first surface and the inner surface, a plurality of openings formed in the one or more surfaces and in fluid communication with the recess, wherein the one or more surfaces comprises a third surface, a first connecting surface connecting the third surface and the first surface, a fourth surface, a second connecting surface connecting the third surface and the fourth surface, a fifth surface, a third connecting surface connecting the fourth surface and the fifth surface, and a sixth surface connecting the fifth surface and the inner surface.

8. The cooling member of claim 7, wherein the third surface and the sixth surface are substantially parallel to the first surface.

9. The cooling member of claim 8, wherein the fourth surface and the fifth surface are substantially parallel to the outer surface.

10. The cooling member of claim 7, wherein the annular cooling member is fabricated from a metal.

11. The cooling member of claim 7, wherein the outer surface has a first width and the inner surface has a second width substantially less than the first width.

12. The cooling member of claim 11, wherein the first surface has a first width and the second surface has a second width substantially greater than the first width.

* * * * *